United States Patent
Chen et al.

(10) Patent No.: US 6,730,580 B2
(45) Date of Patent: May 4, 2004

(54) SILICON SUBSTRATE WAFER FABRICATION METHOD EMPLOYING HALOGEN GETTERING MATERIAL AND/OR PLASMA ANNEALING

(75) Inventors: Sheng-Hsiung Chen, Da Ya Contry (TW); Shun-Long Chen, Hsin-Chu (TW); Hungtse Lin, Nan-tou (TW); Naite Chen, Hsin Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 23 days.

(21) Appl. No.: 09/898,242

(22) Filed: Jul. 3, 2001

(65) Prior Publication Data

US 2003/0008479 A1 Jan. 9, 2003

(51) Int. Cl.⁷ .............................. H01L 21/322
(52) U.S. Cl. ..................................... 438/474
(58) Field of Search .................. 438/58, 143, 402, 438/471–473; 117/2, 932, 934, 54, 73

(56) References Cited

U.S. PATENT DOCUMENTS

| | | | |
|---|---|---|---|
| 4,837,376 A | * | 6/1989 | Schwirtlich et al. |
| 5,194,398 A | * | 3/1993 | Miyachi et al. |
| 5,250,444 A | * | 10/1993 | Khan et al. |
| 5,711,998 A | * | 1/1998 | Shufflebotham |
| 5,753,567 A | | 5/1998 | Banan et al. |
| 5,902,395 A | * | 5/1999 | Nagai et al. ................... 117/18 |
| 5,966,623 A | * | 10/1999 | Khossla et al. |
| 6,180,497 B1 | | 1/2001 | Sato et al. |
| 6,344,083 B1 | * | 2/2002 | Holder ........................ 117/13 |
| 2002/0021996 A1 | * | 2/2002 | Calrk et al. ................. 423/348 |

FOREIGN PATENT DOCUMENTS

JP              61-252824        * 10/1986 ................... 117/13

OTHER PUBLICATIONS

Wijaranakula, "Characterization of Crystal Originated Defects in Czochralski Silicon Using Nonagitated Secco Etching", J. Electrochem. Soc., vol. 141(11), Nov. 1994, pp. 3273–3277.

Graf, et al., "Improvement of Czochralski Silicon Wafers by High–Temperature Annealing", J. Electrochem. Soc., vol. 142(9), Sept. 1995, pp. 3189–3192.

Tamatsuka et al., "High Performance Silicon Wafer Sith Wide Grown–In Void Free Zone and High Density Internal Gettreing Site Achieved Via Rapid Crystal Growth With Nitrogen Doping and High Temperature Hydrogen and/or Argon Annealing", SEH Isobe R&D Center.

* cited by examiner

Primary Examiner—Savitri Mulpuri
(74) Attorney, Agent, or Firm—Tung & Associates

(57) ABSTRACT

Within a Czochralski method for fabricating a silicon substrate wafer which employs pulling a silicon monocrystal ingot from a silicon melt and slicing therefrom the silicon substrate wafer, at least one of: (1) the silicon melt has introduced therein a halogen getter material from an extrinsic source; and (2) the silicon substrate wafer is further treated with a plasma. In accord with the method, the silicon substrate wafer is provided with attenuated defects.

7 Claims, 1 Drawing Sheet

SILICON SUBSTRATE WAFER FABRICATION METHOD EMPLOYING HALOGEN GETTERING MATERIAL AND/ OR PLASMA ANNEALING

BACKGROUND OF THE INVENTION

1. Field of the Invention

The present invention relates generally to methods for fabricating silicon substrate wafers employed for fabricating semiconductor integrated circuit microelectronic fabrications. More particularly, the present invention relates to methods for fabricating, with attenuated defects, silicon substrate wafers employed for fabricating semiconductor integrated circuit microelectronic fabrications.

2. Description of the Related Art

Semiconductor integrated circuit microelectronic fabrications are formed from semiconductor substrate wafers within and upon which are formed semiconductor devices, and over which are formed patterned conductor layers which are separated by dielectric layers.

As semiconductor integrated circuit microelectronic fabrication integration levels have increased and semiconductor device dimensions have decreased, it has become increasingly important in the art of semiconductor integrated circuit microelectronic fabrication to provide, with continually decreasing defect levels, semiconductor substrate wafers, and in particular silicon semiconductor substrate wafers, from which are formed semiconductor integrated circuit microelectronic fabrications. Continually decreasing defect levels are desirable within semiconductor substrate wafers from which are formed semiconductor integrated circuit microelectronic fabrications insofar as defect concentrations and defect sizes within semiconductor substrate wafers, even if relatively constant when fabricating semiconductor integrated circuit microelectronic fabrications, will often have a pronounced detrimental effect under circumstances where semiconductor device dimensions decrease in size when fabricating semiconductor integrated circuit microelectronic fabrications.

While semiconductor substrate wafers having decreased defect levels are thus clearly desirable in the art of semiconductor integrated circuit microelectronic fabrication and often essential in the art of semiconductor integrated circuit microelectronic fabrication, semiconductor substrate wafers having decreased defect levels are nonetheless not always readily obtainable in the art of semiconductor integrated circuit microelectronic fabrication. In that regard, semiconductor substrate wafers having decreased defect levels are not always readily obtainable in the art of semiconductor integrated circuit microelectronic fabrication insofar as there often exists various competing types of defects and various competing sources of defects within semiconductor substrate wafers which may often be attenuated with only a limited number of methods within the art of semiconductor integrated circuit microelectronic fabrication.

It is thus desirable in the art of semiconductor integrated circuit microelectronic fabrication to provide methods and materials through which there may be attenuated defects within semiconductor substrate wafers when fabricating semiconductor substrate wafers.

It is towards the foregoing object that the present invention is directed.

Various methods and materials have been disclosed in the art of semiconductor integrated circuit microelectronic fabrication for providing silicon semiconductor substrate wafers with desirable properties in the art of semiconductor integrated circuit microelectronic fabrication.

Included among the methods and materials, but not limited among the methods and materials, are methods and materials disclosed within: (1) Wijaranakula, in "Characterization of Crystal Originated Defects in Czochralski Silicon Using Nonagitated Secco Etching," J. Electrochem. Soc., Vol. 141(11), November 1994, pp. 3273–77 (a chemical etch method employing a dilute aqueous potassium dichromate and hydrofluoric etchant material for highlighting defects, and in particular crystal originated particle (COP) defects, within silicon semiconductor substrate wafers employed for fabricating semiconductor integrated circuit microelectronic fabrications; (2) Graf et al., in "Improvement of Czochralski Silicon Wafers by High-Temperature Annealing," J. Electrochem. Soc., Vol. 142(9), Sept. 1995, pp. 3189–92 (a series of high temperature hydrogen, argon and oxygen annealing methods for attenuating defects, such as crystal originated particle (COP) defects, within silicon semiconductor substrate wafers employed for fabricating semiconductor integrated circuit microelectronic fabrications); (3) Tamatsuka et al., in "High Performance Silicon Wafer With Wide Grown-In Void Free Zone and High Density Internal Gettering Site Achieved via Rapid Crystal Growth With Nitrogen Doping and High Temperature Hydrogen and/or Argon Annealing," source unknown (a rapid crystal growth, nitrogen doping and hydrogen and/or argon annealing method for attenuating defects, such as crystal originated particle (COP) defects, within silicon semiconductor substrate wafers employed for fabricating semiconductor integrated circuit microelectronic fabrications); (4) Banan et al., in U.S. Pat. No. 5,753,567, (a halogen plasma treatment method for cleaning metallic contaminants from the surfaces of polycrystalline silicon powders employed for fabricating silicon semiconductor substrate wafers in turn employed for fabricating semiconductor integrated circuit microelectronic fabrications); and (5) Sato et al., in U.S. Pat. No. 6,180,497 (a fabrication method for fabricating a porous and terraced topographic silicon semiconductor substrate wafer employed within a silicon on insulator (SOI) silicon semiconductor substrate wafer employed for fabricating semiconductor integrated circuit microelectronic fabrications).

Desirable in the art of semiconductor integrated circuit microelectronic fabrication are additional methods and materials which may be employed for providing, with attenuated defects, silicon semiconductor substrate wafers which may be employed for fabricating semiconductor integrated circuit microelectronic fabrications.

It is towards the foregoing object that the present invention is directed.

SUMMARY OF THE INVENTION

A first object of the present invention is to provide a method for fabricating a silicon semiconductor substrate wafer which may be employed for fabricating a semiconductor integrated circuit microelectronic fabrication.

A second object of the present invention is to provide a method for fabricating the silicon semiconductor substrate wafer in accord with the first object of the present invention, wherein the silicon semiconductor substrate wafer is fabricated with attenuated defects.

A third object of the present invention is to provide a method for fabricating the silicon semiconductor substrate wafer in accord with the first object of the present invention and the second object of the present invention, wherein the method is readily commercially implemented.

In accord with the objects of the present invention, there is provided by the present invention a method for fabricating a silicon substrate wafer.

To practice the method of the present invention, there is first provided a crucible having contained therein a silicon melt. There is then pulled from the silicon melt a silicon ingot while employing a Czochralski method. There is then sliced from the silicon ingot a silicon substrate wafer. Within the method of the present invention, at least one of: (1) the silicon melt has introduced therein a halogen getter material from an extrinsic source; and (2) the silicon substrate wafer is further treated with a plasma.

The present invention provides a method for fabricating a silicon semiconductor substrate wafer which may be employed for fabricating a semiconductor integrated circuit microelectronic fabrication, wherein the silicon semiconductor substrate wafer is fabricated with attenuated defects.

The present invention realizes the foregoing object by fabricating a silicon substrate wafer, such as a silicon semiconductor substrate wafer, while employing a Czochralski method, wherein at least one of: (1) a silicon melt from which is pulled a silicon ingot has introduced therein a halogen getter material from an extrinsic source; and (2) a silicon substrate wafer which is sliced from the silicon ingot is further treated with a plasma.

The method of the present invention is readily commercially implemented.

As will be illustrated in greater detail within the context of the Description of the Preferred Embodiment, as set forth below, a silicon semiconductor substrate wafer fabricated in accord with the present invention may be fabricated employing methods and materials as are generally known in the art of semiconductor integrated circuit microelectronic fabrication, but employed within the context of specific materials limitations and specific process limitations which provide the present invention. Since it is thus at least in part a series of specific materials limitations and specific process limitations which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for fabricating a silicon semiconductor substrate wafer which may be employed for fabricating a semiconductor integrated circuit microelectronic fabrication, wherein the silicon semiconductor substrate wafer is fabricated with attenuated defects.

The present invention realizes the foregoing object by fabricating a silicon substrate wafer, such as a silicon semiconductor substrate wafer, while employing a Czochralski method, wherein at least one of: (1) a silicon melt from which is pulled a silicon ingot has introduced therein a halogen getter material from an extrinsic source; and (2) a silicon substrate wafer which is sliced from the silicon ingot is further treated with a plasma.

Although the present invention provides particular value for fabricating silicon semiconductor substrate wafers which may be employed when fabricating semiconductor integrated circuit microelectronic fabrications, a silicon substrate wafer fabricated in accord with the present invention may be employed for fabricating a microelectronic fabrication selected from the group included but not limited to integrated circuit microelectronic fabrications, solar cell optoelectronic microelectronic fabrications, sensor image array optoelectronic microelectronic fabrications and display image array optoelectronic microelectronic fabrications.

Figure 1:
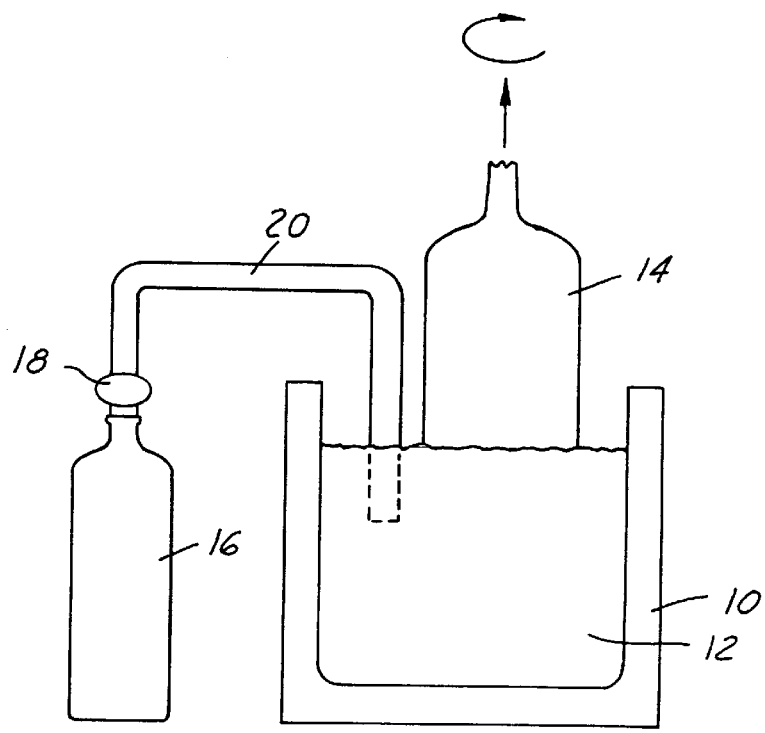
FIG. 1 shows a schematic diagram of a Czochralski silicon ingot pulling apparatus in accord with the present invention.

Referring now to FIG. 1, there is shown a schematic diagram of a Czochralski silicon ingot pulling apparatus which may be employed for pulling a silicon ingot in accord with the method of the present invention.

Shown in FIG. 1 with respect to the Czochralski silicon ingot pulling apparatus is a crucible 10 having contained therein a silicon melt 12 from which is pulled a silicon monocrystal ingot 14 in accord with a Czochralski method.

Within the preferred embodiment of the present invention, each of the crucible 10, the silicon melt 12 and the silicon monocrystal ingot 14 is otherwise generally conventional in the art of semiconductor integrated circuit microelectronic fabrication and otherwise in general in accord with a Czochralski method for pulling a silicon ingot as is otherwise generally conventional in the art of semiconductor integrated circuit microelectronic fabrication. In that regard, the crucible 10 will typically and preferably be formed at least in part of a high temperature resistant quartz material in order to contain the silicon melt 12 which is typically and preferably maintained at a temperature of from about 1100 to about 1250 degrees centigrade. Similarly, the silicon melt 12 will typically and preferably result from melting a polycrystalline silicon source material fabricated employing methods as are conventional in the art of semiconductor integrated circuit microelectronic fabrication. Yet similarly, the silicon melt 12 will typically and preferably have incorporated therein electrically active dopants, such as but not limited to boron, phosphorus and arsenic electrically active dopants, as are otherwise generally known in the art of semiconductor integrated circuit microelectronic fabrication for fabricating an electrically active silicon monocrystal ingot 14, although the present invention and the preferred embodiment of the present invention may also be employed under circumstances wherein the silicon melt 12 does not contain therein electrically active dopants. Under such circumstances, the method of the present invention will in its most general embodiment provide a method for fabricating a silicon substrate wafer, although in its more preferred embodiment the method of the present invention will provide a method for fabricating a silicon semiconductor substrate wafer.

Finally, within the present invention and the preferred embodiment of the present invention with respect to the silicon monocrystal ingot 14, the silicon monocrystal ingot 14 is typically and preferably fabricated employing the Czochralski method while employing a monocrystal seed crystal as a silicon monocrystal ingot 14 growth surface, while employing a rotation rate, a pulling rate and a silicon melt 12 temperature which provides the silicon monocrystal ingot 14 of desired physical dimensions and desired chemical composition.

Shown also within the Czochralski silicon ingot pulling apparatus whose schematic diagram is illustrated in FIG. 1 is a halogen getter material source 16 which is connected through a valve 18 to a halogen getter material sparging tube manifold 20, for purposes of introducing a halogen getter material (which may also be considered to be a halogen dopant) into the silicon melt 12 within the crucible 10 from the extrinsic halogen getter material source 16 while pulling the silicon monocrystal ingot 14 from the silicon melt 12 while employing the Czochralski method (i.e., the present invention preferably does not employ an intrinsic halogen getter material intrinsic to a silicon material from which is formed the silicon melt 12).

Within the present invention and the preferred embodiment of the present invention, a halogen getter material contained within the halogen getter material source 16 may be selected from the group including but not limited to: (1) pure halogen getter materials, such as fluorine (F2), chlorine (Cl2), bromine (Br2) and iodine (I2); (2) hydrogen halide getter materials, such as but not limited to hydrogen fluoride (HF), hydrogen chloride (HCl), hydrogen bromide (HBr) and hydrogen iodide (HI); (3) fully substituted silicon halide getter materials, such as but not limited to silicon tetrafluoride (SiF4), silicon tetrachloride (SiCl4), silicon tetrabromide (SiBr4) silicon tetraiodide (SiI4); and (4) mixed substituted silicon hydrogen halide getter material analogs of the fully substituted silicon halide getter materials (i.e. having 1–3 hydrogen atoms and 3–1 halide atoms). Preferably, the present invention and the preferred embodiment of the present invention do not employ a nitrogen getter/dopant material introduced intrinsically or extrinsically into the silicon melt 12 when pulling the silicon monocrystal ingot 14 therefrom while employing the Czochralski method.

Within the present invention and the preferred embodiment of the present invention, at least one of silicon tetrafluoride and silicon tetrachloride is a preferred halogen getter material to be introduced into the silicon melt 12 within the present invention and the preferred embodiment of the present invention from the extrinsic halogen getter material source 16.

Typically and preferably, the halogen getter material is introduced into the silicon melt 12 from the extrinsic halogen getter material source 16 to provide a halogen getter material concentration within the silicon melt 12 of from about 0.01 to about 1 weight percent, more preferably from about 0.01 to about 0.5 weight percent and most preferably from about 0.01 to about 0.1 weight percent. Such a concentration of the halogen getter material may be monitored and controlled as a partial pressure of the halogen getter material, or of one of its reactive or decomposition components, above the silicon melt 12 within the crucible 10.

As is understood by a person skilled in the art, by introducing within the context of the present invention the halogen getter material into the silicon melt 12 extrinsically from the halogen getter material source 16 in accord with the Czochralski pulling apparatus whose schematic diagram is illustrated in FIG. 1, a concentration of undesirable impurities, and in particular undesirable metallic impurities, within the silicon melt 12 may be controlled within the silicon melt 12 and vaporized from the silicon melt 12, which in turn will provide reduced contaminants within the silicon monocrystal ingot 14 which is pulled from the silicon melt 12 and ultimately attenuated defects within a silicon substrate wafer which is sliced from the silicon monocrystal ingot 14.

As is further understood by a person skilled in the art, and although not specifically illustrated within the schematic diagrams which accompany this disclosure, subsequent to pulling completely the silicon monocrystal ingot 14 from the silicon melt 12 in accord with the Czochralski silicon ingot pulling apparatus whose schematic diagram is illustrated in FIG. 1, the silicon monocrystal ingot 14 is allowed to cool, nominally to room temperature. The silicon monocrystal ingot 14 is then machined to a nominally cylindrical shape, typically with an identification flat, grove or channel machined longitudinally therein and keyed to a crystal orientation of the silicon monocrystal ingot 14. The silicon monocrystal ingot 14 is then sliced to form a plurality of silicon substrate wafers as are employed when fabricating any of several of the microelectronic fabrications as are indicated above. Typically and preferably, a thickness of a silicon substrate wafer will correspond in general with a diameter of a silicon monocrystal ingot from which it is sliced, and the thickness will be in a range of from about 720 to about 760 millimeters.

Figure 2:
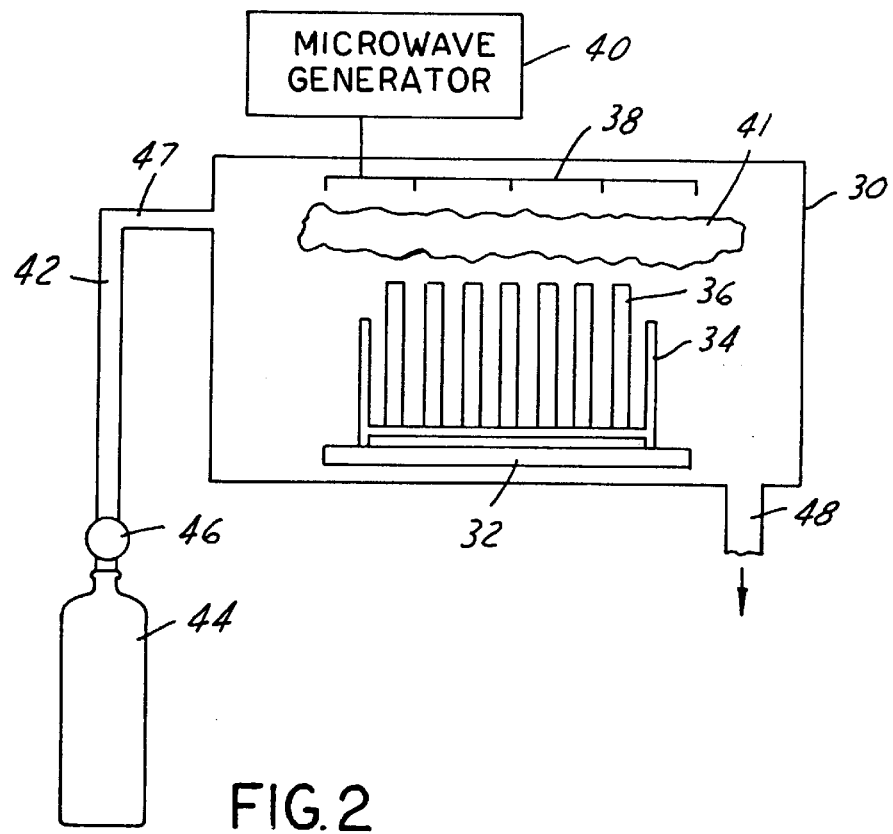
FIG. 2 shows a schematic diagram of a plasma reactor apparatus which may be employed for treating a silicon semiconductor substrate wafer in accord with the present invention.

Referring now to FIG. 2, there is shown a schematic diagram of a plasma reactor apparatus which may be employed for further processing of a series of silicon substrate wafers sliced from a silicon monocrystal ingot, in accord with the silicon monocrystal ingot 14 which is pulled from the silicon melt 12 as illustrated in accord with the Czochralski silicon pulling apparatus whose schematic diagram is illustrated in FIG. 2.

Shown in FIG. 2 is a reactor chamber 30, in a first instance having incorporated therein a inlet port 47 and an outlet port 48, wherein the reactor chamber 30 further has positioned therein a platen 32 in turn having positioned thereupon a silicon substrate wafer carrier 34 in turn having positioned therein a series of silicon substrate wafers 36. As is understood by a person skilled in the art, the reactor chamber 30, the inlet port 47, the exhaust port 48, the platen 32 and the silicon substrate wafer carrier 34 are otherwise generally conventional in the art of semiconductor integrated circuit microelectronic fabrication for fabricating a series of silicon substrate wafers, such as the series of silicon substrate wafers 36, but may also be adapted for fabricating a single silicon substrate wafer rather than a series of silicon substrate wafers, such as the series of silicon substrate wafers 36.

Shown also within the schematic diagram of FIG. 2 is a radio frequency plasma electrode 38 which is connected to a radio frequency power source 40 for purposes of generating and maintaining a plasma 41 within the reactor chamber 30 in the vicinity of the series of silicon substrate wafers 36. Finally, there is also shown within the schematic diagram of FIG. 2 a plasma gas source 44 which supplies plasma gas to a manifold 42 through a valve 46, such as to supply a plasma gas to the reactor chamber 30 through the inlet port 47 in order to feed the plasma 41 which is generated and maintained within the reactor chamber 30 in the vicinity of the series of silicon substrate wafers 36.

Within the present invention and the preferred embodiment of the present invention, a plasma gas which is supplied into the reactor chamber 30 from the plasma gas source 44 typically and preferably comprises at least one of: (1) a reducing plasma gas, such as but not limited to hydrogen; and (2) an inert plasma gas, such as but not limited to helium, neon, argon and krypton. More typically and preferably, the plasma gas comprises at least one of hydrogen and argon. Yet more typically and preferably, the plasma gas comprises both hydrogen and argon. Still yet more typically and preferably, the plasma gas consists of hydrogen, argon or a binary mixture thereof.

Similarly, and in accord with the present invention and the preferred embodiment of the present invention, the plasma gas is activated to provide the plasma 41 within which the series of silicon substrate wafers 36 is plasma annealed, rather than a purely thermal annealing of a series of silicon substrate wafers within a thermal annealing gas, as is otherwise conventional in the art of silicon substrate wafer fabrication and disclosed in greater detail within the references cited within the Description of the Related Art. By employing within the context of the present invention the plasma annealing of the series of silicon substrate wafers 36 as illustrated within the schematic diagram of FIG. 2, rather than a purely thermal annealing of the series of silicon substrate wafers 36 as illustrated within the schematic diagram of FIG. 2, there is provided within the context of the present invention a more efficient reduction of defects within the series of silicon substrate wafers 36 at a lower temperature.

Within the present invention and the preferred embodiment of the present invention, the plasma 41 which is employed for plasma annealing the series of silicon substrate wafers 36 as illustrated within the schematic diagram of FIG. 2 (when provided as a batch of one wafer or 25 pieces eight inch diameter silicon substrate wafers positioned within a quartz silicon substrate wafer carrier 34 positioned upon the platen 32 within the reactor chamber 30) is typically and preferably provided employing: (1) a reactor chamber pressure of from about 10 to about 25 torr, more preferably from about 0.01 to about 10 torr and most preferably from about 0.01 to about 5 torr; (2) a microwave frequency power source 40 power of from about 1 to about 100 watts, more preferably from about 1 to about 60 watts and most preferably from about 10 to about 40 watts; (3) a silicon substrate wafer 36 temperature of from about 900 to about 1200 degrees centigrade, more preferably from about 950 to about 1100 degrees centigrade and most preferably from about 950 to about 1050 degrees centigrade; (4) a hydrogen flow rate of up to about 1 standard cubic centimeters per minute (sccm), more preferably from about 1 to about 100 standard cubic centimeters per minute (sccm) and most preferably from about 1 to about 50 standard cubic centimeters per minute (sccm), in conjunction with an argon flow rate of up to about 1 standard cubic centimeters per minute (sccm), more preferably from about 1 to about 100 standard cubic centimeters per minute (sccm) and most preferably from about 1 to about 50 standard cubic centimeters per minute (sccm); and (5) a plasma annealing time period of from about 1 to about 40 minutes, more preferably from about 1 to about 20 minutes and most preferably from about 1 to about 10 minutes.

As is understood by a person skilled in the art, although the schematic diagrams of FIG. 1 and FIG. 2 illustrate implicitly a sequential silicon melt halogen getter material gettering when pulling a silicon monocrystal ingot from a silicon melt while employing a Czochralski method, followed by a plasma treatment, and preferably a hydrogen and/or argon plasma treatment, of a series of silicon substrate wafers sliced from the silicon monocrystal ingot, it is intended within the present invention that either: (1) the halogen getter material extrinsically introduced into the silicon melt when pulling the silicon monocrystal ingot therefrom; or (2) the plasma treatment of the series of silicon substrate wafers sliced from the silicon monocrystal ingot, may independently be employed to ultimately provide, at least in part, a series of silicon substrate wafers with attenuated defects in accord with the present invention. With respect to defects which may be attenuated within silicon substrate wafers in accord with the present invention, such defects may include, but are not limited to, metallic contaminant induced defects and crystal originated particle (COP) induced defects. Either of the foregoing defects, and in particular the attenuation of such defects, may lead to improvement in semiconductor device structures within semiconductor devices fabricated employing silicon semiconductor substrate wafers, and in particular to improvement in gate dielectric structures within field effect transistor (FET) devices fabricated employing silicon semiconductor substrate wafers.

As is further understood by a person skilled in the art, it is intended within the context of the present invention to provide a silicon semiconductor substrate wafer which may be employed directly to fabricate semiconductor devices therein, absent an epitaxial silicon semiconductor layer formed thereupon. Thus, it is not intended within the context of the present invention to provide an epitaxial silicon semiconductor layer upon a silicon substrate wafer 36 prior to or subsequent to plasma annealing the silicon substrate wafer 36 in accord with the schematic diagram of FIG. 2.

As is finally understood by a person skilled in the art, the preferred embodiment of the present invention is illustrative of the present invention rather than limiting of the present invention. Revisions and modifications may be made to methods, materials, apparatus and dimensions through which is fabricated a silicon substrate wafer in accord with the preferred embodiment of the present invention while still providing a method for fabricating a silicon substrate wafer in accord with the present invention, further in accord with the accompanying claims.

What is claimed is:

1. A method for fabricating a silicon substrate wafer comprising:

provideng a crucible having contained therein a silicon melt;

pulling from the silicon melt a monocrystalline silicon ingot while employing a Czochralski method; and slicing from the monocrystalline silicon ingot a monocrystalline silicon substrate wafer, wherein:

the silicon melt has introduced therein a halogen getter material from an extrinsic source; and the monocrystalline silicon substrate wafer is further annealed in one of reducing plasma gases or inert plasma gases at a substrate temperature of from about 900 to about 1200 degrees centigrade, wherein annealing is performed subsequent to slicing the silicon ingot.

2. The method of claim 1 wherein the monocrystalline silicon substrate wafer is employed within a microelectronic fabrication selected from the group consisting of integrated circuit microelectronic fabrications, solar cell optoelectronic microelectronic fabrications, sensor image array optoelectronic microelectronic fabrications and display image array optoelectronic microelectronic fabrications.

3. The method of claim 1 wherein the halogen getter material is selected from the group consisting of halogens, halogen halides, fully substituted silicon halides and mixed substituted silicon hydrogen halides.

4. The method of claim 1 wherein the halogen getter material is a fully substituted silicon halide.

5. The method of claim 1 wherein the halogen getter material is at least one of silicon tetrachloride and silicon tetrafluoride.

6. The method of claim 1 wherein the plasma employs at least one plasma gas selected from the group consisting of hydrogen and argon.

7. The method of claim 1 wherein the monocrystalline silicon substrate wafer is further treated with the plasma absent an epitaxial silicon layer formed upon the monocrystalline silicon substrate wafer.

* * * * *